United States Patent
Fuke et al.

(10) Patent No.: US 8,331,062 B2
(45) Date of Patent: Dec. 11, 2012

(54) MAGNETO-RESISTANCE EFFECT ELEMENT, MAGNETIC HEAD, MAGNETIC RECORDING/REPRODUCING DEVICE AND MAGNETIC MEMORY

(75) Inventors: Hiromi Fuke, Yokohama (JP); Susumu Hashimoto, Nenma-ku (JP); Masayuki Takagishi, Kunitachi (JP); Hitoshi Iwasaki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/291,743

(22) Filed: Nov. 8, 2011

(65) Prior Publication Data
US 2012/0049302 A1 Mar. 1, 2012

Related U.S. Application Data

(63) Continuation of application No. 11/892,890, filed on Aug. 28, 2007.

(30) Foreign Application Priority Data

Sep. 28, 2006 (JP) ................................. 2006-265836

(51) Int. Cl.
*G11B 5/39* (2006.01)
*H01L 29/82* (2006.01)
*H01L 23/12* (2006.01)

(52) U.S. Cl. ..................................... 360/324.1

(58) Field of Classification Search ....... 360/324–324.2; 257/421
See application file for complete search history.

(56) References Cited

U.S. PATENT DOCUMENTS

| | | | |
|---|---|---|---|
| 3,775,328 A | 11/1973 | Denes | |
| 4,650,708 A | 3/1987 | Takahashi | |
| 5,116,782 A | 5/1992 | Yamaguchi et al. | |
| 5,139,376 A | 8/1992 | Pumphrey | |
| 5,257,531 A | 11/1993 | Motosugi | |
| 5,599,742 A | 2/1997 | Kadomura | |
| 5,653,841 A | 8/1997 | Krishnamurthy | |
| 5,885,750 A | 3/1999 | Hsiao | |
| 5,936,402 A | 8/1999 | Schep et al. | |
| 5,949,622 A | 9/1999 | Kamiguchi et al. | |
| 6,114,056 A | 9/2000 | Inomata et al. | |
| 6,219,275 B1 | 4/2001 | Nishimura | |
| 6,340,533 B1 | 1/2002 | Ueno et al. | |

(Continued)

FOREIGN PATENT DOCUMENTS

CN 1431651 7/2003

(Continued)

OTHER PUBLICATIONS

English-machine translation of JP 2005-285936 A to Yuasa et al., published on Oct. 13, 2005.*

(Continued)

*Primary Examiner* — Will J Klimowicz
(74) *Attorney, Agent, or Firm* — Nixon & Vanderhye P.C.

(57) ABSTRACT

A magneto-resistance effect element includes: a first magnetization layer of which a magnetization is substantially fixed in one direction; a second magnetization layer of which a magnetization is rotated in accordance with an external magnetic field; an intermediate layer which contains insulating portions and magnetic metallic portions and which is provided between the first magnetic layer and the second magnetic layer; and a pair of electrodes to flow current in a direction perpendicular to a film surface of a multilayered film made of the first magnetic layer, the intermediate layer and the second magnetic layer; wherein the magnetic metallic portions of the intermediate layer contain non-ferromagnetic metal.

12 Claims, 5 Drawing Sheets

U.S. PATENT DOCUMENTS

| | | |
|---|---|---|
| 6,469,926 B1 | 10/2002 | Chen |
| 6,473,275 B1 | 10/2002 | Gill |
| 6,538,921 B2 | 3/2003 | Daughton et al. |
| 6,567,246 B1 | 5/2003 | Sakakima et al. |
| 6,707,649 B2 | 3/2004 | Hasegawa et al. |
| 6,929,957 B2 | 8/2005 | Min et al. |
| 6,937,446 B2 | 8/2005 | Kamiguchi et al. |
| 6,937,447 B2 | 8/2005 | Okuno et al. |
| 7,046,489 B2 | 5/2006 | Kamiguchi et al. |
| 7,116,575 B1 | 10/2006 | Katti |
| 7,240,419 B2 | 7/2007 | Okuno et al. |
| 7,265,950 B2 | 9/2007 | Okuno et al. |
| 7,355,883 B2 | 4/2008 | Okuno et al. |
| 2001/0009063 A1 | 7/2001 | Saito et al. |
| 2001/0014000 A1 | 8/2001 | Tanaka et al. |
| 2002/0051380 A1 | 5/2002 | Kamiguchi et al. |
| 2002/0054461 A1 | 5/2002 | Fujiwara et al. |
| 2002/0058158 A1 | 5/2002 | Odagawa et al. |
| 2002/0097536 A1 | 7/2002 | Komuro et al. |
| 2002/0135935 A1 | 9/2002 | Covington |
| 2003/0128481 A1 | 7/2003 | Seyama et al. |
| 2004/0042127 A1 | 3/2004 | Hoshiya et al. |
| 2005/0042478 A1 | 2/2005 | Okuno et al. |
| 2005/0073778 A1 | 4/2005 | Hasegawa et al. |
| 2005/0094327 A1 | 5/2005 | Okuno et al. |
| 2005/0276998 A1 | 12/2005 | Sato |
| 2006/0164764 A1 | 7/2006 | Kamiguchi et al. |
| 2007/0253122 A1 | 11/2007 | Fukuzawa et al. |

FOREIGN PATENT DOCUMENTS

| | | |
|---|---|---|
| EP | 0 687 917 | 12/1995 |
| EP | 0 877 398 | 11/1998 |
| EP | 1 328 027 | 7/2003 |
| EP | 1 607 941 | 12/2005 |
| JP | 60-098518 | 6/1985 |
| JP | 02-173278 | 7/1990 |
| JP | 05-160123 | 6/1993 |
| JP | 07-022399 | 1/1995 |
| JP | 09-306733 | 11/1997 |
| JP | 10-173252 | 6/1998 |
| JP | 11-238923 | 8/1999 |
| JP | 11-510911 | 9/1999 |
| JP | 11-293481 | 10/1999 |
| JP | 2000-188435 | 7/2000 |
| JP | 2000-293982 | 10/2000 |
| JP | 2001-143227 | 5/2001 |
| JP | 2002-208744 | 7/2002 |
| JP | 2003-204095 | 7/2003 |
| JP | 2005-285936 | 10/2005 |
| JP | 2005-353236 | 12/2005 |
| KR | 2005-0027159 | 3/2005 |
| KR | 2005-0118649 | 12/2005 |
| WO | 97/47982 | 12/1997 |

OTHER PUBLICATIONS

Japanese Office Action issued for corresponding Japanese Patent Application No. 2006-265836, dated Jun. 21, 2011.

Brief English translation of Japanese Office Action issued for corresponding Japanese Patent Application No. 2006-265836, dated Jun. 21, 2011.

N. Garcia, et al. "Magnetoresistance in Excess of 200% in Ballistic Ni Nanocontacts at Room Temperature and 100 Oe," Physical Review Letters, vol. 82, No. 14, Apr. 5, 1999, pp. 2923-2926. (Abstract).

Yonsei University Master Thesis, "Voltage Difference Amplification Circuit for Improving the Sensing Characteristics of MRAM", Dec. 2005 and brief English-language translation thereof.

Seoul University Doctoral Thesis, A Study on the Development of New Spin Wave Structures for Magnetoresistive RAM based on Giant Magnetoresistive and Tunneling, Aug. 2001 and brief English-language translation thereof.

J.J. Versluijs, et al., "Magnetoresistance of Half-Metallic Oxide Nanocontracts," Physical Review Letters, vol. 87, No. 2, Jul. 9, 2001, pp. 026601-1 through 026601-4.

Ceramist vol. 4, No. 5, Special Edition, Magnetic Sensor Technologies and Applications Using Giant Magnetoresistance Effect, Oct. 2001.

Fukuzawa et al., U.S. Appl. No. 11/783,011, filed Apr. 5, 2007.

* cited by examiner

MAGNETO-RESISTANCE EFFECT ELEMENT, MAGNETIC HEAD, MAGNETIC RECORDING/REPRODUCING DEVICE AND MAGNETIC MEMORY

CROSS-REFERENCE TO RELATED APPLICATIONS

This application is a continuation of U.S. patent application Ser. No. 11/892,890, filed Aug. 28, 2007, and is based upon and claims the benefit of priority from the prior Japanese Patent Application No. 2006-265836, filed on Sep. 28, 2006; the entire contents of both of which are incorporated herein by reference.

BACKGROUND OF THE INVENTION

1. Field of the Invention

The present invention relates to a magneto-resistance effect element which is configured such that a current is flowed in the direction perpendicular to the film surface thereof. The present invention also relates to a magnetic head, a magnetic recording/reproducing device and a magnetic memory which utilize the magneto-resistance effect element according to the present invention.

2. Description of the Related Art

Recently, the performance of a magnetic device, particularly such as a magnetic head is enhanced by means of Giant Magneto-Resistance Effect (GMR) made of a multilayered magnetic structure. Particularly, since a spin valve film (SV film) can exhibit a larger GMR effect, the SV film has developed the magnetic device such as a magnetic head and MRAM (Magnetic Random Access Memory).

The "spin valve" film has such a structure as sandwiching a non-magnetic metal spacer layer between two ferromagnetic layers and is configured such that the magnetization of one ferromagnetic layer (often called as a "pinning layer" or "fixed magnetization layer) is fixed by the magnetization of an anti-ferromagnetic layer and the magnetization of the other ferromagnetic layer (often called as a "free layer" or "free magnetization layer") is rotated in accordance with an external magnetic field. With the spin valve film, the large MR effect can be obtained by the variation of the relative angle in magnetization between the pinned layer and the free layer.

A conventional spin valve film is employed for a CIP (Current In plane)-GMR element. In the CIP-GMR element, a sense current is flowed to the SV film in the direction parallel to the film surface thereof. Recently, attention is paid to a CPP (Current Perpendicular to Plane)-GMR element and a TMR (Tunneling Magneto Resistance) element because the CPP-GMR element and the TMR element can exhibit the respective large MR effect in comparison with the CIP element. In the CPP-GMR element and the TMR element, a sense current is flowed to the SV film in the direction almost perpendicular to the film surface thereof.

Recently, it was confirmed that a large MR effect with high MR-ratio can be obtained from the minute coupling of Ni wires (Reference 1).

Then, the minute magnetic coupling is formed three-dimensionally so as to realize a magneto-resistance effect element with high MR ratio (Reference 2). In this case, the three-dimensional minute magnetic coupling is carried out by means of EB (Electron beam) irradiation, FIB (Focused Ion beam) irradiation or AFM (Atomic Force Microscope).

[Reference 1] Phys. Rev. Lett. 82 2923 (1999)
[Reference 2] JP-A 2003-204095 (KOKAI)

It is considered that the MR effect as described above is originated from the rapid variation in magnetization at the minute magnetic coupling point. Namely, if the magnetic domain to be formed at the minute magnetic coupling point is narrowed, the large MR effect can be obtained. The magnetic domain can be indirectly narrowed by decreasing the size (diameter) of the minute magnetic coupling point (the size (diameter) of the ferromagnetic metallic portion of the complex spacer layer). However, too small size of the minute magnetic coupling point may increase the resistance thereof excessively.

On the other hand, if the size of the minute magnetic coupling point is enlarged, the resistance of the minute magnetic coupling point can be reduced, but too large size of the minute magnetic coupling point may strengthen the magnetic coupling between the pinned layer and the free layer via the minute magnetic coupling so as to increase the interlayer-coupling. The increase of the interlayer-coupling causes undesirably the shift of the operating point toward the higher magnetic field at the magnetic head containing the minute magnetic coupling.

BRIEF SUMMARY OF THE INVENTION

It is an object of the present invention to provide a new magneto-resistance effect element which can exhibit a larger MR effect without the shift of operating point due to the low resistance and the high interlayer-coupling.

In order to achieve the above object, an aspect of the present invention relates to a magneto-resistance effect element, comprising: a first magnetization layer of which a magnetization is substantially fixed in one direction; a second magnetization layer of which a magnetization is rotated in accordance with an external magnetic field; an intermediate layer which contains insulating portions and magnetic metallic portions and which is provided between the first magnetic layer and the second magnetic layer; and a pair of electrodes to flow current in a direction perpendicular to a film surface of a multilayered film made of the first magnetic layer, the intermediate layer and the second magnetic layer; wherein the magnetic metallic portions of the intermediate layer contain non-ferromagnetic metal.

The inventors had intensely studied to achieve the above object. As a result, according to the aspect of the present invention, an intermediate layer containing insulating portions and magnetic metallic portions is provided between the first magnetic layer and the second magnetic layer to cause the magnetic coupling via the magnetic metallic portions of the intermediate layer. Then, non-ferromagnetic metal is contained in the magnetic metallic portions of the intermediate layer so that the magnetization of the magnetic metallic portions can be reduced.

As a result, since the width of the magnetic wall, which is formed in the magnetic metallic portion of the intermediate layer, is decreased in the thickness direction, the resistance change ratio, that is, the MR effect can be enhanced and the interlayer-coupling between the first magnetic layer and the second magnetic layer, which sandwich the intermediate layer, can be suppressed. Particularly, even though the diameter of the minute magnetic coupling point is increased so as to decrease the element resistance, the interlayer-coupling can be reduced.

The non-ferromagnetic metal may be at least one selected from the group consisting of Cu, Cr, V, Ta, Nb, Sc, Ti, Mn, Zn, Ga, Ge, Zr, Y, Tc, Re, B, In, C, Si, Sn, Ca, Sr, Ba, Au, Ag, Pd, Pt, Ir, Rh, Ru, Os and Hf. Particularly, the non-ferromagnetic metal may contain at least Cu.

Similarly, the magnetic metallic portions of the intermediate layer may contain at least one of Fe, Co and Ni. Also, the first magnetic layer and the second magnetic layer may contain at least one of Fe, Co and Ni.

According to the aspects of the present invention can be provided a new magneto-resistance effect element which can exhibit a larger MR effect without the shift of operating point due to the low resistance and the high interlayer-coupling.

DETAILED DESCRIPTION OF THE INVENTION

Hereinafter, the present invention will be described in detail with reference to the drawings.
(Magneto-Resistance Effect Element)

Figure 1:
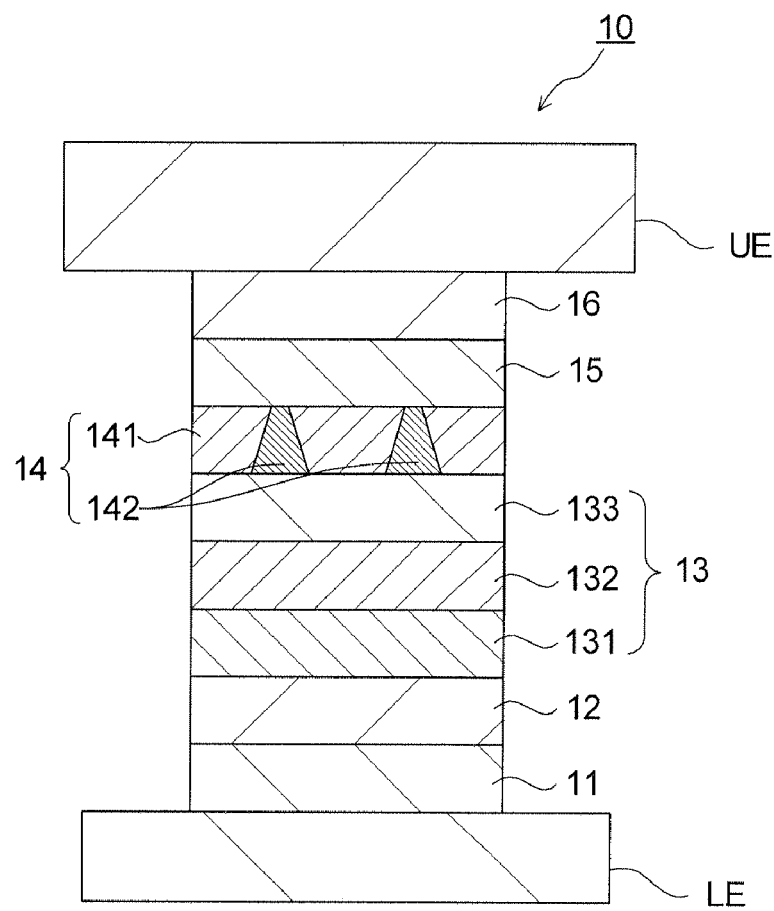
FIG. 1 is a structural view illustrating an embodiment of the magneto-resistance effect element according to the present invention.

FIG. 1 is a perspective view illustrating a magneto-resistance effect element according to an embodiment of the present invention. Some or all components throughout the drawings in the present application are schematically illustrated so that the illustrated sizes (thickness) and thickness ratio for the components is different from the real sizes and thickness ratio for the components.

The magneto-resistance effect element 10 illustrated in FIG. 1 includes a bottom electrode LE and a top electrode UE which are disposed so as to sandwich a plurality of layers composing the magneto-resistance effect element 10. Concretely, the magneto-resistance effect element 10 is configured such that an underlayer 11, an antiferromagnetic layer 12, a complex pinned layer 13, an intermediate layer 14, a free layer 15 and a protective layer 16 are subsequently formed on the bottom electrode LE. The complex pinned layer 13 is configured such that a magnetic anti-parallel coupling layer 132 is sandwiched between a first pinned layer 131 and a second pinned layer 132. The intermediate layer 14 is composed of insulating portions 141 and magnetic metallic portions 142 which are disposed alternately in the intermediate layer 14.

In this embodiment, the complex pinned layer 13, the intermediate layer 14 and the free layer 15 constitute the spin valve film.

The complex pinned layer 13 corresponds to a first magnetic layer, as defined in claims, of which the magnetization is substantially fixed in one direction, and the free layer 15 corresponds to a second magnetic layer, as defined in claims, of which the magnetization is rotated in accordance with an external magnetic field. The intermediate layer 14 corresponds to an intermediate layer as defined in claims. The first magnetic layer may be made of a single magnetic layer instead of a multilayered structure such as the complex magnetic layer 13.

The bottom electrode LE and the top electrode UE function as flowing a sense current to the magneto-resistance effect element 10 in the direction perpendicular to the film surface of the spin valve film. As a result, the magneto-resistance effect element 10 constitutes a CPP (Current Perpendicular to Plane) type magneto-resistance effect element configured such that the sense current is flowed in the direction perpendicular to the film surface of the element.

The underlayer 11 may be formed as a two-layered structure of a buffer layer and a seed layer, for example. The buffer layer can relax the surface roughness of the bottom electrode LE and be made of Ta, Ti, W, Zr, Hf, Cr or an alloy thereof. The seed layer functions as controlling the crystalline orientation of the spin valve film and be made of Ru, $(Fe_x Ni_{100-x})_{100-y}X_y$ (X=Cr, V, Nb, Hf, Zr, Mo; $15<x<25$, $20<y<45$).

The antiferromagnetic layer 12 may be made of antiferromagnetic material (e.g., PtMn, PdPtMn, IrMn, RuRhMn) which applies unidirectional anisotropy to the complex pinned layer 13 so as to fix the magnetization of the complex pinned layer 13.

The first pinned layer 131 and the second pinned layer 132 of the complex pinned layer 13 may be made of, e.g., Fe, Co, Ni, FeCo alloy or FeNi alloy. The magnetic anti-parallel coupling layer 132 functions as coupling in antiferromagnetism the first pinned layer 131 and the second pinned layer 132 and may be made of Ru, Ir or Rh.

The insulating portion 141 of the intermediate layer 14 may be made of an oxide, a nitride, an oxynitride or a carbide containing at least one selected from the group consisting of Al, Mg, Li, Si, Ca, Sc, Ti, V, Cr, Mn, Fe, Co, Ni, Cu, Zn, Ga, Se, Sr, Y, Zr, Nb, Mo, Pd, Ag, Cd, In, Sn, Sb, Ba, Ka, Hf, Ta, W, Re, Pt, Hg, Pb, Bi and lanthanoid. The insulating portion 141 may be made of another electrically insulating material.

The magnetic metallic portion 142 of the intermediate layer 14 functions as an electric current path to flow current therethrough in the direction perpendicular to the film surface of the intermediate layer 14 and may be made of single ferromagnetic material such as Fe, Co, Ni or ferromagnetic alloy material. When a magnetic field directed at the direction opposite to the direction of the magnetization of the second pinned layer 132 is applied to the free layer 15 so that the direction of the magnetization of the free layer 15 is aligned in the direction of the magnetic field, the direction of the magnetization of the second pinned layer 133 becomes anti-parallel to the direction of the magnetization of the free layer 15. In this case, since the magnetic metallic portion 142 is sandwiched between the ferromagnetic layers (complex pinned layer 13 and the free layer 15) with the respective different directions of magnetization, a magnetic domain wall DW is formed in the magnetic metallic portion 142.

In this embodiment, the diameter "d" of the magnetic metallic portion 142 is not constant in the thickness direction as shown in FIG. 1 (In FIG. 1, the top width of the metallic portion 142 becomes larger than the bottom width of the metallic portion 142). In this case, the typical diameter "d" can be defined by the average diameter in thickness direction.

In this embodiment, non-ferromagnetic metal is incorporated in the magnetic metallic portion 142 of the intermediate layer 14. The non-ferromagnetic metal can be selected from the group consisting of Cu, Cr, V, Ta, Nb, Sc, Ti, Mn, Zn, Ga, Ge, Zr, Y, Tc, Re, B, In, C, Si, Sn, Ca, Sr, Ba, Au, Ag, Pd, Pt, Ir, Rh, Ru, Os, Hf. Preferably, the non-magnetic metal is Cu. In this case, the interlayer-coupling between the complex pinned layer 13 (second pinned layer 133) and the free layer 15 can be suppressed even though the diameter of the minute magnetic coupling point, that is, the magnetic metallic portion 142 is enlarged so as to decrease the resistance between the complex pinned layer 13 and the free layer 15.

The free layer (free magnetization layer) 15 may be made of ferromagnetic material (e.g., Fe, Co, Ni, FeCo alloy, FeNi alloy) so that the magnetization of the free layer 15 can be rotated in accordance with an external magnetic field. In this embodiment, the free layer 15 is formed as a single-layered structure, but may be formed as a multilayered structure composed of a plurality of layers stacked.

The protective layer 16 functions as protecting the spin valve film. The protective layer 16 may be formed as a two-layered structure of Cu/Ru or a three-layered structure of Cu/Ta/Ru.

Figure 2:
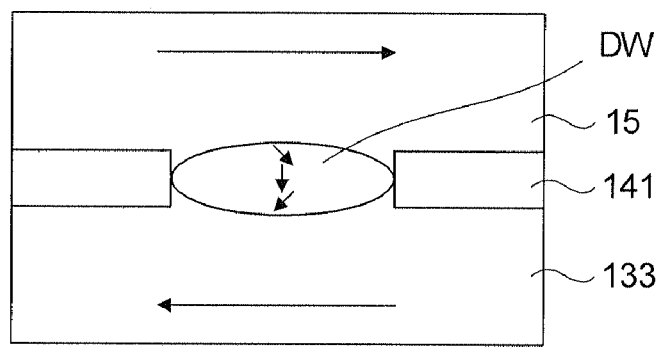
FIG. 2 is an explanatory view schematically showing the cross sectional state of the magnetization of the magneto-resistance effect element in FIG. 1 in the vicinity of the intermediate layer thereof.
Figure 3:
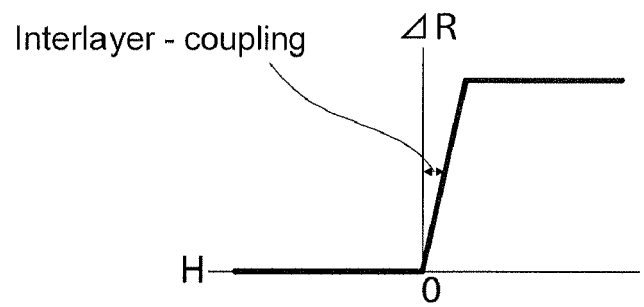
FIG. 3 is a graph showing the dependence of the resistance change ratio ΔR with the external magnetic field H in the magneto-resistance effect element in FIG. 1.

FIG. 2 is an explanatory view schematically showing the cross sectional state of the magnetization of the magneto-resistance effect element 10 in the vicinity of the intermediate layer 14. FIG. 3 is a graph showing the R—H characteristic of the magneto-resistance effect element 10.

In the magneto-resistance effect element 10 of this embodiment, as shown in FIG. 2, since the non-ferromagnetic metal as described above is incorporated in the magnetic metallic portion 142 of the intermediate layer 14, the magnetization (Ms) of the magnetic metallic portion 142 is reduced. Therefore, the interlayer-coupling between the complex pinned layer 13 (second pinned layer 133) and the free layer 15 can be suppressed and the width of the magnetic domain wall DW, which is formed in the magnetic metallic portion 142, is decreased in the thickness direction so as to enhance the resistance change ratio, that is, the MR effect.

In real, in the magneto-resistance effect element 10 of this embodiment, as shown in FIG. 3, the shift of the R—H curve by the external magnetic field, which is originated from the interlayer-coupling, can not be almost recognized, and the resistance change $\Delta R$ becomes high.

Figure 4:
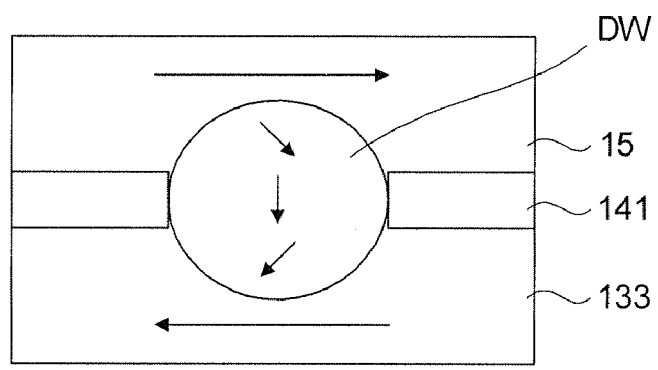
FIG. 4 is an explanatory view schematically showing the cross sectional state of the magnetization of a magneto-resistance effect element which is different from the magneto-resistance effect element in FIG. 1 and which does not contain a non-ferromagnetic portion in the ferromagnetic portion of the intermediate layer thereof.
Figure 5:
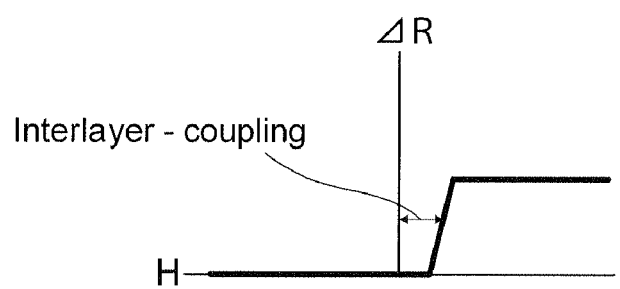
FIG. 5 is a graph showing the dependence of the resistance change ratio ΔR with the external magnetic field H in the magneto-resistance effect element in FIG. 4.

FIG. 4 is an explanatory view schematically showing the cross sectional state of the magnetization of a magneto-resistance effect element which is different from the magneto-resistance effect element 10 and which does not contain the non-ferromagnetic metal in the magnetic metallic portion 142 of the intermediate layer 14. FIG. 5 is a graph showing the R—H characteristic of the magneto-resistance effect element in FIG. 4.

In the case that the non-ferromagnetic metal is not incorporated in the magnetic metallic portion 142 of the intermediate layer 14, the width of the magnetic domain wall DW in the magnetic metallic portion 142 becomes almost equal to the diameter of the magnetic domain wall DW and becomes larger than the width of the insulating portion 141. Therefore, the interlayer-coupling between the complex pinned layer 13 (second pinned layer 133) and the free layer 15 is increased so as to reduce the resistance change $\Delta R$.

In real, in the magneto-resistance effect element 10 of this embodiment, as shown in FIG. 5, the shift of the R—H curve by the external magnetic field, which is originated from the interlayer-coupling, is observed, and the resistance change $\Delta R$ becomes low.

(Method for Manufacturing a Magneto-Resistance Effect Element)

Then, the method for manufacturing the magneto-resistance effect element will be schematically described. First of all, on the substrate are subsequently formed the bottom electrode LE, the underlayer 11, the antiferromagnetic layer 12, the complex pinned layer 13, the intermediate layer 14, the free layer 15, the protective layer 16 and the top electrode UE. Normally, each layer is formed under depressurized atmosphere. Hereinafter, the forming process of each layer will be described.

(1) Formation of Bottom Electrode Le Through Antiferromagnetic Layer 12

The bottom electrode 11 is formed on the (not shown) substrate by means of micro-process in advance. Then, the underlayer 11 and the antiferromagnetic layer 12 are formed.

(2) Formation of Complex Pinned Layer 13

Then, the first pinned layer 131, the magnetic anti-parallel coupling layer 132 and the second pinned layer 133 are subsequently formed. In this case, a non-ferromagnetic metallic layer may be formed on the second pinned layer 133. Also, an alloy layer made of the material constituting the pinned layer and the material constituting the non-ferromagnetic metallic layer may be formed on the second pinned layer 133.

(3) Formation of Intermediate Layer 14

Then, the formation of the intermediate layer 14 will be described. The intermediate layer 14 is composed of the insulating portions 141 made of $Al_2O_3$ and the magnetic metallic portions 142 made of a mixture of main Fe component and Cu component added to the main Fe component.

First of all, the first metallic layer is formed on the second pinned layer 133. The first metallic layer contains the main Fe component as a supplier for the magnetic metallic layer 142 and the Cu component. Then, the second metallic layer (e.g., Al), which is to be converted into the insulating portions 141, is formed on the first metallic layer. Then, ion beams of inert gas (e.g., Ar) are irradiated onto the second metallic layer so that the pre-treatment (ion treatment) can be carried out for the second metallic layer. According to the ion treatment, the elements of the first metallic layer are partially infiltrated into the second metallic layer. Instead of the ion treatment, another energy applying means may be employed. For example, the plasma treatment or the thermal treatment can be exemplified, but the energy applying means is not limited to the above-listed ones only if the elements of the first metallic layer are partially infiltrated into the second metallic layer.

Then, an oxidizing gas (e.g., an inert gas containing oxygen gas) is supplied so that the second metallic layer can be oxidized to form the insulating portions 141. In this case, the oxidizing condition is determined so that some elements of the first metallic layer infiltrated into the second metallic layer are unlikely to be oxidized. According to the oxidizing treatment, the second metallic layer is converted into the insulating portions made of $Al_2O_3$, and the elements of the first metallic layer forms the magnetic metallic portions 142.

Herein, the oxidizing method is not restricted only if the magnetic metallic portions 142 are not oxidized and remains. Concretely, ion beam oxidizing method, plasma oxidizing method or ion assisted oxidizing method may be employed. Instead of the oxidizing treatment, nitriding treatment or carbonizing treatment can be employed.

The intermediate layer 14 can be formed as follows. First of all, the first metallic layer as the supplier of the magnetic metallic portions 142 is formed on or as the second pinned layer 133. Thereafter, the second metallic layer (e.g., Al) to be converted into the insulating portions 141 is formed on the first metallic layer. After the second metallic layer is formed, an oxidizing gas (e.g., an inert gas containing oxygen gas) is supplied so that the second metallic layer can be oxidized to form the insulating layer. Concretely, ion beam oxidizing method, plasma oxidizing method or ion assisted oxidizing method may be employed as the oxidizing treatment. Instead of the oxidizing treatment, nitriding treatment or carbonizing treatment can be employed.

Then, ion beams of inert gas (e.g., Ar) are irradiated onto the insulating portions so that the post-treatment (ion treatment) can be carried out for the insulating portions. According to the ion treatment, the elements of the first metallic layer are infiltrated into the insulating layer to form the intermediate layer 14 containing the insulating portions 141 made of $Al_2O_3$ and the magnetic metallic portions 142. Instead of the ion treatment, the plasma treatment or the thermal treatment may be employed.

(4) Formation of Free Layer 15, Protective Layer 16 and Top Electrode UE

Then, the free layer 15 is formed on the intermediate layer 14, and the protective layer 16 and the top electrode UE are formed on the free layer 15, thereby forming the magneto-resistance effect element 10.

(5) Thermally Treatment

The magneto-resistance effect element 10 is thermally treated under magnetic field so that the direction of the magnetization of the first pinned layer 131 is fixed.

(Magnetic Head and Magnetic Recording/Reproducing Device)

The magneto-resistance effect element is installed in advance in an all-in-one magnetic head assembly allowing both the recording/reproducing, and mounted as the head assembly at the magnetic recording/reproducing device.

Figure 6:
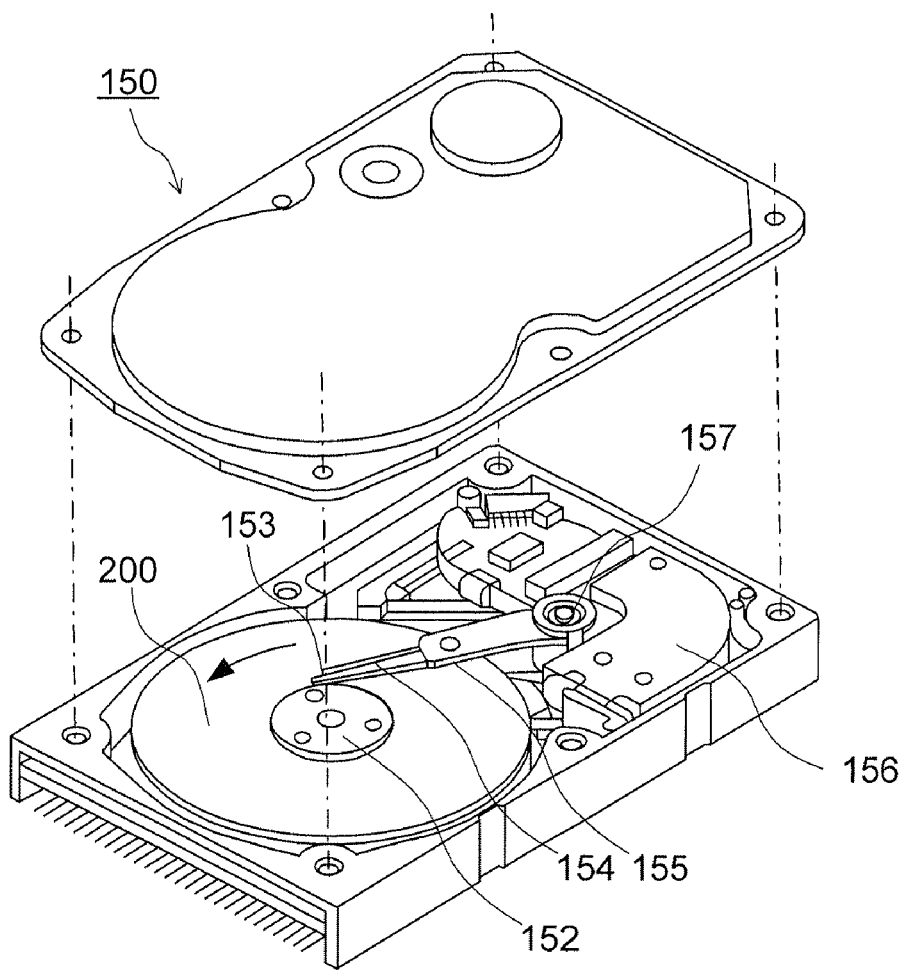
FIG. 6 is a perspective view illustrating a magnetic recording/reproducing device according to the present invention.

FIG. 6 is a perspective view illustrating the schematic structure of the magnetic recording/reproducing device. The magnetic recording/reproducing device 150 illustrated in FIG. 6 constitutes a rotary actuator type magnetic recording/reproducing device. In FIG. 6, a magnetic recording disk 200 is mounted to a spindle 152 to be turned in the direction designated by the arrow A by a motor (not shown) which is driven in response to control signals from a drive unit controller (not shown). In FIG. 6, the magnetic recording/reproducing apparatus 150 may be that provided with a single magnetic recording disk 200, but with a plurality of magnetic recording disks 200.

A head slider 153 recording/reproducing information to be stored in the magnetic recording disk 200 is mounted on a tip of a suspension 154 of a thin film type. The head slider 153 mounts at the tip the magnetic head containing the magnetic resistance effect element as described in above embodiments.

When the magnetic recording disk 200 is rotated, such a surface (ABS) of the head slider 153 as being opposite to the magnetic recording disk 200 is floated from on the main surface of the magnetic recording disk 200. Alternatively, the slider may constitute a so-called "contact running type" slider such that the slider is in contact with the magnetic recording disk 200.

The suspension 154 is connected to one edge of the actuator arm 155 with a bobbin portion supporting a driving coil (not shown) and the like. A voice coil motor 156 being a kind of a linear motor is provided at the other edge of the actuator arm 155. The voice coil motor 156 is composed of the driving coil (not shown) wound around the bobbin portion of the actuator arm 155 and a magnetic circuit with a permanent magnet and a counter yoke which are disposed opposite to one another so as to sandwich the driving coil.

The actuator arm 155 is supported by ball bearings (not shown) provided at the upper portion and the lower portion of the spindle 157 so as to be rotated and slid freely by the voice coil motor 156.

Figure 7:
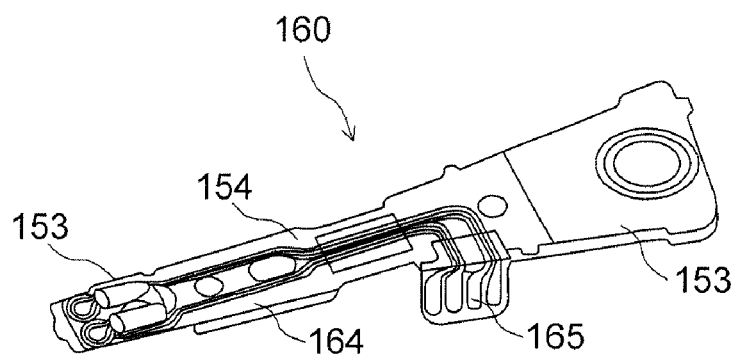
FIG. 7 is a perspective view illustrating the magnetic head assembly of the magnetic recording/reproducing device in FIG. 6.

FIG. 7 is an enlarged perspective view illustrating a portion of the magnetic head assembly positioned at the tip side thereof from the actuator arm 155, as viewed from the side of the magnetic recording disk 200. As illustrated in FIG. 7, the magnetic head assembly 160 has the actuator arm 155 with the bobbin portion supporting the driving coil and the like. The suspension 154 is connected with the one edge of the actuator arm 155.

Then, the head slider 153 with the magnetic head containing the magneto-resistance effect element as defined in above-embodiments is attached to the tip of the suspension 154. The suspension 154 includes a lead wire 164 for writing/reading signals, where the lead wire 164 is electrically connected with the respective electrodes of the magnetic head embedded in the head slider 153. In the drawing, reference numeral "165" denotes an electrode pad of the assembly 160.

In the magnetic recording/reproducing device illustrated in FIGS. 6 and 7, since the magneto-resistance effect element as described in the above embodiments is installed, the information magnetically recorded in the magnetic recording disk 200 under higher density recording than normal recording can be read out properly.

(Magnetic Memory)

The magneto-resistance effect element as described above can constitute a magnetic memory such as a magnetic random access memory (MRAM) where memory cells are arranged in matrix.

Figure 8:
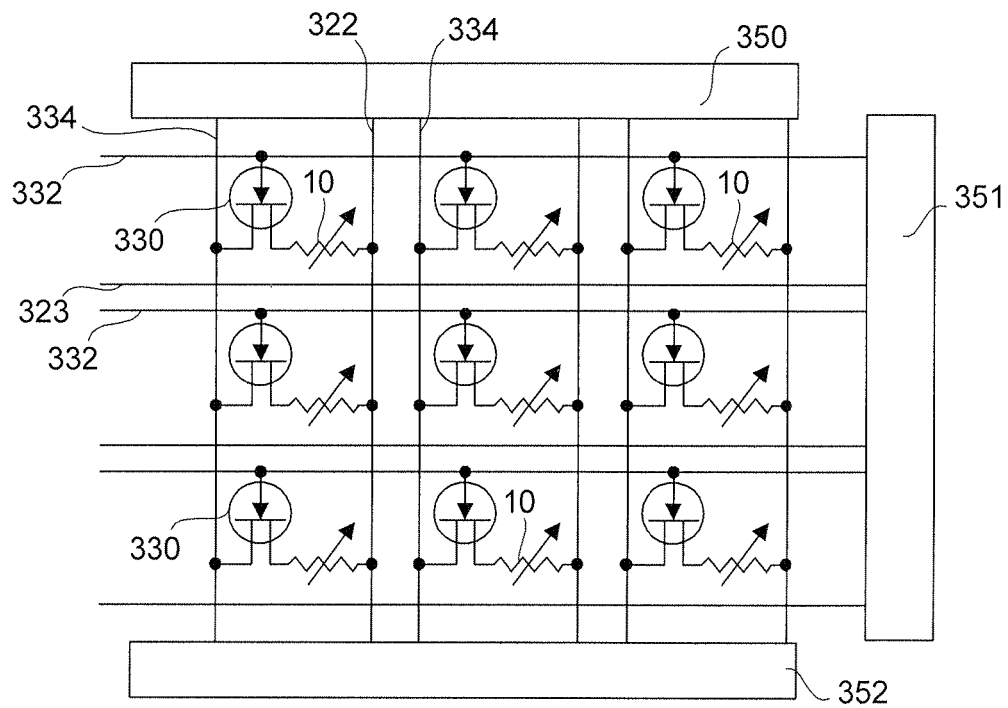
FIG. 8 is a view illustrating a magnetic memory matrix according to the present invention.

FIG. 8 is a view illustrating an embodiment of the magnetic memory matrix according to the present invention. This drawing shows a circuit configuration when the memory cells are arranged in an array. In order to select one bit in the array, a column decoder 350 and a line decoder 351 are provided, where a switching transistor 330 is turned ON by a bit line 334 and a word line 332 and to be selected uniquely, so that the bit information recorded in a magnetic recording layer (free layer) in the magneto-resistance effect film 10 can be read out by being detected by a sense amplifier 352. In order to write the bit information, a writing current is flowed in a specific write word line 323 and a bit line 322 to generate a magnetic field for writing.

Figure 9:
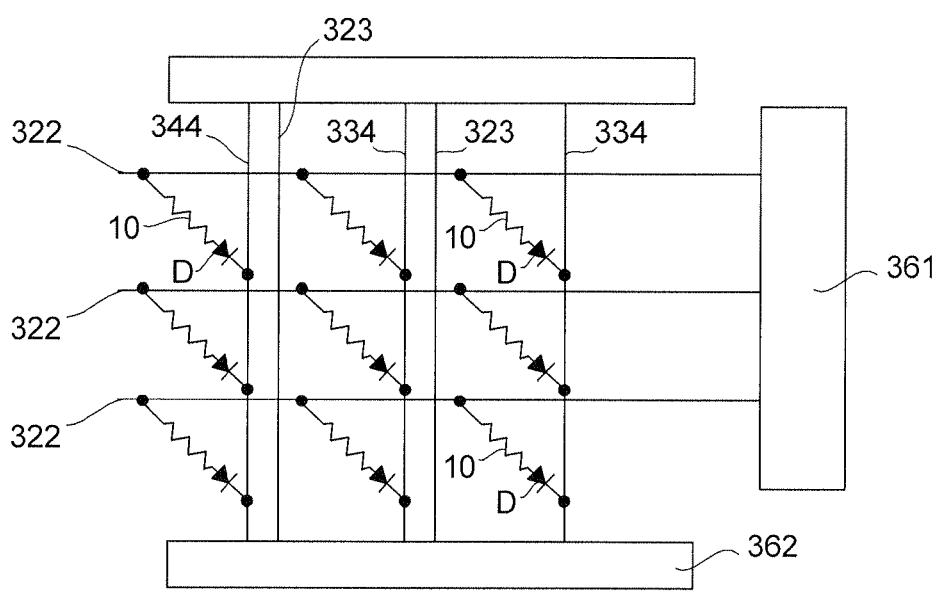
FIG. 9 is a view illustrating another magnetic memory matrix according to the present invention.

FIG. 9 is a view illustrating another embodiment of the magnetic memory matrix according to the present invention. In this case, a bit line 322 and a word line 334 which are arranged in matrix are selected by decoders 360, 361, respectively, so that a specific memory cell in the array is selected. Each memory cell is configured such that the magneto-resistance effect film 10 and a diode D is connected in series. Here, the diode D plays a role of preventing a sense current from detouring in the memory cell other than the selected magneto-resistance effect film 10. A writing is performed by a magnetic field generated by flowing the writing current in the specific bit line 322 and the word line 323, respectively.

Figure 10:
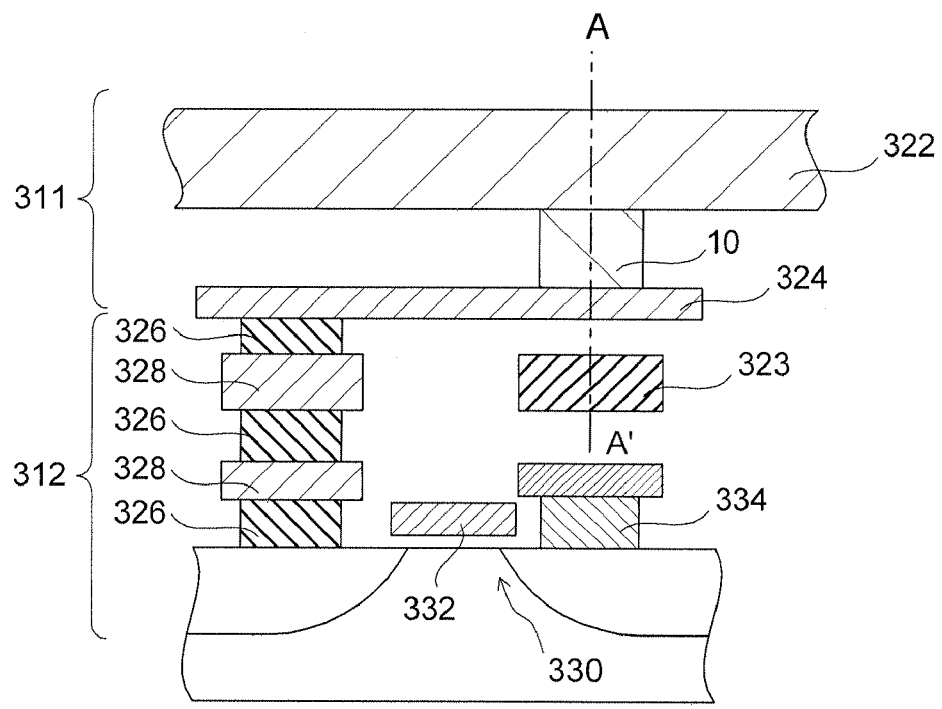
FIG. 10 is a cross sectional view illustrating an essential part of the magnetic memory.
Figure 11:
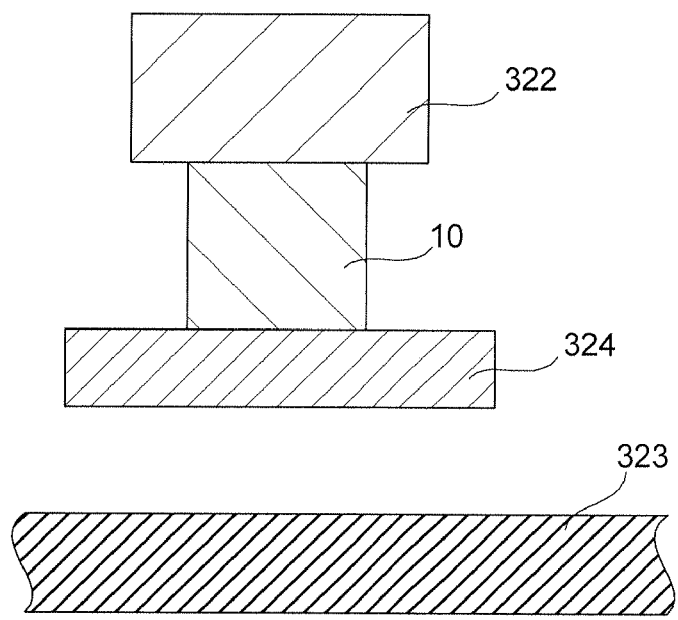
FIG. 11 is a cross sectional view of the magnetic memory illustrated in FIG. 10, taken on line "A-A".

FIG. 10 is a cross sectional view illustrating a substantial portion of the magnetic memory in an embodiment according to the present invention. FIG. 11 is a cross sectional view of the magnetic memory illustrated in FIG. 10, taken on line "A-A". The configuration shown in these drawings corresponds to a 1-bit memory cell included in the magnetic memory shown in FIG. 8 or FIG. 9. This memory cell includes a memory element part 311 and an address selection transistor part 312.

The memory element part 311 includes the magneto-resistance effect film 10 and a pair of wirings 322, 324 connected to the magneto-resistance effect film 10. The magneto-resistance effect film 10 is the magneto-resistance effect element (CCP-CPP element) as described in the above embodiments.

Meanwhile, in the address selection transistor part 312, a transistor 330 having connection therewith via a via 326 and an embedded wiring 328 is provided. The transistor 330 performs switching operations in accordance with voltages applied to a gate 332 to control the opening/closing of the current confining path between the magneto-resistance effect film 10 and the wiring 334.

Further, below the magneto-resistance effect film 10, a write wiring 323 is provided in the direction substantially orthogonal to the wiring 322. These write wirings 322, 323 can be formed of, for example, aluminum (Al), copper (Cu), tungsten (W), tantalum (Ta) or an alloy containing any of these elements.

In the memory cell of such a configuration, when writing bit information into the magneto-resistance effect element 10, a writing pulse current is flowed in the wirings 322, 323, and a synthetic magnetic field induced by the writing current is applied to appropriately invert the magnetization of a recording layer of the magneto-resistance effect element 10.

Further, when reading out the bit information, a sense current is flowed through the magneto-resistance effect element 10 including the magnetic recording layer and a lower electrode 324 to measure a resistance value of or a fluctuation in the resistance values of the magneto-resistance effect element 10.

The magnetic memory according to the embodiment can assure writing and reading by surely controlling the magnetic domain of the recording layer even though the cell is miniaturized in size, with the use of the magneto-resistance effect element according to the above-described embodiment.

EXAMPLES

The present invention will be described in detail in view of Examples.

Example 1

Example 1 relating to the magneto-resistance effect element 10 will be described. In Example 1, the magneto-resistance effect element 10 was formed as follows:

Underlayer 11: Ta 5 nm/NiFeCr 7 nm
Antiferromagnetic layer 12: PtMn 15 nm
First pinned layer 131: $Co_9Fe_1$ 3.3 nm
Magnetic antiparallel coupling layer 132: Ru 0.9 nm
Second pinned layer 132: $Fe_5Co_5$ 2.5 nm/Cu 0.1 nm The underlayer 11 through the second pinned layer 132 were subsequently formed. Then, the Al layer with a thickness of 0.9 nm was formed and oxidized under Ar ion atmosphere. Then, the ion treatment was carried out to form the multilayered structure of the intermediate layer 14: the Al oxide/FeCo—Cu metallic layer. Then, Free layer 15: $Fe_5Co_5$ 2.5 nm
Protective layer 16: Cu 1 nm/Ta 2 nm/Ru 15 nm were formed.

The thus obtained magneto-resistance effect element 10 was thermally treated at 270° C. during ten hours under magnetic field. As a result, in Example 1, the RA of the magneto-resistance effect element 10 was 0.5 $\Omega\mu m^2$. Then, the MR value was 200%, and the interlayer-coupling between the complex pinned layer 133 and the free layer 15 was 20 Oe.

Example 2

Example 2 relating to the magneto-resistance effect element 10 will be described. In Example 2, the magneto-resistance effect element 10 was formed as follows:

Underlayer 11: Ta 5 nm/Ru 2 nm
Antiferromagnetic layer 12: PtMn 15 nm
First pinned layer 131: $Co_9Fe_1$ 3.3 nm
Magnetic antiparallel coupling layer 132: Ru 0.9 nm
Second pinned layer 132: $Fe_5Co_5$ 2.5 nm/Cu 0.1 nm The underlayer 11 through the second pinned layer 132 were subsequently formed. Then, the Al layer with a thickness of 0.9 nm was formed and oxidized under Ar ion atmosphere. Then, the ion treatment was carried out to form the multilayered structure of the intermediate layer 14: the Al oxide/FeCo—Cu metallic layer. Then, Free layer 15: $Fe_5Co_5$ 2.5 nm
Protective layer 16: Cu 1 nm/Ta 2 nm/Ru 15 nm were formed.

The thus obtained magneto-resistance effect element 10 was thermally treated at 270° C. during ten hours under magnetic field. As a result, in Example 2, the RA of the magneto-resistance effect element 10 was 0.3 $\Omega\mu m^2$. Then, the MR value was 150%, and the interlayer-coupling between the complex pinned layer 133 and the free layer 15 was 25 Oe.

Example 3

Example 3 relating to the magneto-resistance effect element 10 will be described. In Example 3, the magneto-resistance effect element 10 was formed as follows:

Underlayer 11: Ta 5 nm/NiFeCr 7 nm
Antiferromagnetic layer 12: PtMn 15 nm
First pinned layer 131: $Co_9Fe_1$ 3.3 nm
Magnetic antiparallel coupling layer 132: Ru 0.9 nm
Second pinned layer 132: $Fe_5Co_5$ 2.5 nm/Zr 0.1 nm The underlayer 11 through the second pinned layer 132 were subsequently formed. Then, the Al layer with a thickness of 0.9 nm was formed and oxidized under Ar ion atmosphere. Then, the ion treatment was carried out to form the multilayered structure of the intermediate layer 14: the Al oxide/FeCo—Zr metallic layer.

Then,
Free layer 15: $Fe_5Co_5$ 2.5 nm
Protective layer 16: Cu 1 nm/Ta 2 nm/Ru 15 nm were formed.

The thus obtained magneto-resistance effect element 10 was thermally treated at 270° C. during ten hours under magnetic field. As a result, in Example 3, the RA of the magneto-resistance effect element 10 was 0.5 $\Omega\mu m^2$. Then, the MR value was 180%, and the interlayer-coupling between the complex pinned layer 133 and the free layer 15 was 23 Oe.

Example 4

Example 4 relating to the magneto-resistance effect element 10 will be described. In Example 4, the magneto-resistance effect element 10 was formed as follows:

Underlayer 11: Ta 5 nm/Ru 2 nm
Antiferromagnetic layer 12: PtMn 15 nm
First pinned layer 131: $Co_9Fe_1$ 3.3 nm
Magnetic antiparallel coupling layer 132: Ru 0.9 nm
Second pinned layer 132: $Fe_5Co_5$ 2.5 nm/Zr 0.1 nm The underlayer 11 through the second pinned layer 132 were subsequently formed. Then, the Al layer with a thickness of 0.9 nm was formed and oxidized under Ar ion atmosphere. Then, the ion treatment was carried out to form the multilayered structure of the intermediate layer 14: the Al oxide/FeCo—Zr metallic layer. Then, Free layer 15: $Fe_5Co_5$ 2.5 nm
Protective layer 16: Cu 1 nm/Ta 2 nm/Ru 15 nm were formed.

The thus obtained magneto-resistance effect element 10 was thermally treated at 270° C. during ten hours under magnetic field. As a result, in Example 4, the RA of the magneto-resistance effect element 10 was 0.4 $\Omega\mu m^2$. Then, the MR value was 120%, and the interlayer-coupling between the complex pinned layer 133 and the free layer 15 was 28 Oe.

Example 5

Example 5 relating to the magneto-resistance effect element 10 will be described. In Example 5, the magneto-resistance effect element 10 was formed as follows:
Underlayer 11: Ta 5 nm/NiFeCr 7 nm
Antiferromagnetic layer 12: PtMn 15 nm
First pinned layer 131: $CO_9Fe_1$ 3.3 nm
Magnetic antiparallel coupling layer 132: Ru 0.9 nm
Second pinned layer 132: $Fe_5Co_5$ 2.5 nm/Cu 0.2 nm The underlayer 11 through the second pinned layer 132 were subsequently formed. Then, the Al layer with a thickness of 0.9 nm was formed and oxidized under Ar ion atmosphere. Then, the ion treatment was carried out to form the multilayered structure of the intermediate layer 14: the Al oxide/FeCo—Cu metallic layer. Then, Free layer 15: $Fe_5Co_5$ 2.5 nm
Protective layer 16: Cu 1 nm/Ta 2 nm/Ru 15 nm were formed.

The thus obtained magneto-resistance effect element 10 was thermally treated at 270° C. during ten hours under magnetic field. As a result, in Example 5, the RA of the magneto-resistance effect element 10 was 0.5 $\Omega\mu m^2$. Then, the MR value was 220%, and the interlayer-coupling between the complex pinned layer 133 and the free layer 15 was 15 Oe.

Example 6

Example 6 relating to the magneto-resistance effect element 10 will be described. In Example 6, the magneto-resistance effect element 10 was formed as follows:
Underlayer 11: Ta 5 nm/NiFeCr 7 nm
Antiferromagnetic layer 12: PtMn 15 nm
First pinned layer 131: $CO_9Fe_1$ 3.3 nm
Magnetic antiparallel coupling layer 132: Ru 0.9 nm
Second pinned layer 132: $(Fe_5Co_5)_{0.9}Cu_{0.1}$ 2.5 nm The underlayer 11 through the second pinned layer 132 were subsequently formed. Then, the Al layer with a thickness of 0.9 nm was formed and oxidized under Ar ion atmosphere. Then, the ion treatment was carried out to form the multilayered structure of the intermediate layer 14: the Al oxide/FeCo—Cu metallic layer. Then, Free layer 15: $Fe_5Co_5$ 2.5 nm
Protective layer 16: Cu 1 nm/Ta 2 nm/Ru 15 nm were formed.

The thus obtained magneto-resistance effect element 10 was thermally treated at 270° C. during ten hours under magnetic field. As a result, in Example 6, the RA of the magneto-resistance effect element 10 was 0.5 $\Omega\mu m^2$. Then, the MR value was 230%, and the interlayer-coupling between the complex pinned layer 133 and the free layer 15 was 18 Oe.

In Examples, the second pinned layer 133 contains Cu or Zr, but may contain another non-magnetic metal such as Cr, V, Ta, Nb, Sc, Ti, Mn, Zn, Ga, Ge, Y, Tc, Re, B, In, C, Si, Sn, Ca, Sr, Ba, Au, Ag, Pd, Pt, Ir, Rh, Ru, Os or Hf. In these cases using the non-magnetic metal except Cu or Zr, the same effects as in Examples were obtained. Namely, according to the magneto-resistance effect element of to the present invention, the interlayer-coupling between the complex pinned layer and the free layer can be suppressed and the relatively large MR value can be obtained.

Although the present invention was described in detail with reference to the above examples, this invention is not limited to the above disclosure and every kind of variation and modification may be made without departing from the scope of the present invention.

In the application of the magneto-resistance effect element to a reproducing magnetic head, if a top and bottom shields are added to the magneto-resistance effect element, the detecting resolution of the magnetic head can be defined.

Moreover, the magneto-resistance effect element can be applied for both of a longitudinal magnetic recording type magnetic head and a vertical magnetic recording type magnetic recording type magnetic head. Also, the magneto-resistance effect element can be applied for both of a longitudinal magnetic recording/reproducing device and a vertical magnetic recording/reproducing device.

The magnetic recording/reproducing device may be a so-called stationary type magnetic device where a specific recording medium is installed therein or a so-called removable type magnetic device where a recording medium can be replaced.

What is claimed is:

1. A magneto-resistance effect element, comprising:
a first magnetization layer including Fe and Co at a predetermined composition ratio therebetween;
a second magnetization layer including Fe and Co at the predetermined composition ratio;
an intermediate layer provided between said first magnetization layer and said second magnetization layer, the intermediate layer including insulating portions and magnetic metallic portions, the magnetic metallic portions including a ferromagnetic material and a non-ferromagnetic metal, the ferromagnetic material including Fe and Co at the predetermined composition ratio; and
a pair of electrodes to provide current in a direction perpendicular to a film surface of a multilayered film including said first magnetization layer, said intermediate layer and said second magnetization layer.

2. The magneto-resistance effect element as set forth in claim 1,
wherein said non-ferromagnetic metal is at least one selected from the group consisting of Cu, Cr, V, Ta, Nb, Sc, Ti, Mn, Zn, Ga, Ge, Zr, Y, Tc, Re, B, In, C, Si, Sn, Ca, Sr, Ba, Au, Ag, Pd, Pt, Ir, Rh, Ru, Os and Hf.

3. The magneto-resistance effect element as set forth in claim 2,
wherein said non-ferromagnetic metal contains at least Cu.

4. The magneto-resistance effect element as set forth in claim 1,
wherein said insulating portions of said intermediate layer include a compound comprising at least one of oxygen, nitrogen and carbon.

5. The magneto-resistance effect element as set forth in claim 1,
wherein said intermediate layer suppresses an interlayer-coupling between said first magnetization layer and said second magnetization layer.

6. The magneto-resistance effect element as set forth in claim 1,
   wherein in said intermediate layer, magnetic domain walls formed in said magnetic metallic portions are narrowed to enhance an MR effect of said magneto-resistance effect element.

7. A magnetic head comprising a magneto-resistance effect element as set forth in claim 1.

8. A magnetic recording/reproducing device comprising a magnetic recording medium and a magneto-resistance effect element as set forth in claim 1.

9. A magnetic memory comprising a magneto-resistance effect element as set forth in claim 1.

10. The magneto-resistance effect element as set forth in claim 1,
    wherein the first magnetization layer includes Fe and Co as principle components;
    wherein the second magnetization layer includes Fe and Co as principle components; and
    wherein the magnetic metallic portions include Fe and Co as principle components.

11. The magneto-resistance effect element as set forth in claim 1,
    wherein the first magnetization layer is made of Fe and Co;
    wherein the second magnetization layer is made of Fe and Co; and
    wherein the magnetic metallic portions include Fe, Co and Cu.

12. A magneto-resistance effect element, comprising:
    a first magnetization layer including Fe and Co at a predetermined composition ratio therebetween;
    a second magnetization layer including Fe and Co at the predetermined composition ratio;
    an intermediate layer provided between the first magnetization layer and the second magnetization layer, the intermediate layer including insulating portions and magnetic metallic portions, the magnetic metallic portions including a ferromagnetic material and a non-ferromagnetic metal for reducing an interlayer-coupling between the first magnetization layer and the second magnetization layer, the ferromagnetic material including Fe and Co at the predetermined composition ratio; and
    a pair of electrodes to provide current in a direction perpendicular to a film surface of a multilayered film including the first magnetization layer, the intermediate layer and the second magnetization layer.

* * * * *

UNITED STATES PATENT AND TRADEMARK OFFICE
CERTIFICATE OF CORRECTION

PATENT NO. : 8,331,062 B2  
APPLICATION NO. : 13/291743  
DATED : December 11, 2012  
INVENTOR(S) : Fuke et al.

Page 1 of 1

It is certified that error appears in the above-identified patent and that said Letters Patent is hereby corrected as shown below:

On the Title Page, Item (73) should read

Item --(73) Assignee: Kabushiki Kaisha Toshiba, Tokyo (JP);
TDK Corporation, Tokyo (JP)--

Signed and Sealed this
Seventeenth Day of June, 2014

Michelle K. Lee
*Deputy Director of the United States Patent and Trademark Office*